(12) United States Patent
August, Jr. et al.

(10) Patent No.: US 6,246,589 B1
(45) Date of Patent: Jun. 12, 2001

(54) RETENTION CLIP FOR RETAINING A COMPACT FLASH DRIVE ON A PC BOARD

(75) Inventors: Joseph M. August, Jr., Elgin; Kenneth S. Laughlin, Arlington Heights, both of IL (US)

(73) Assignee: 3Com Corporation, Rolling Meadows, IL (US)

( * ) Notice: Subject to any disclaimer, the term of this patent is extended or adjusted under 35 U.S.C. 154(b) by 0 days.

(21) Appl. No.: 09/321,968

(22) Filed: May 28, 1999

(51) Int. Cl.[7] ........................................................ H05K 7/14
(52) U.S. Cl. ........................ 361/801; 361/747; 361/759; 361/807; 24/548
(58) Field of Search .......................... 439/325, 327–328, 439/329, 629, 157, 345, 372, 373; 361/704, 719, 717, 732, 740, 759, 801, 807, 809; 174/52; 24/459, 521, 563, 548; 257/659

(56) References Cited

U.S. PATENT DOCUMENTS

| | | | |
|---|---|---|---|
| 5,174,781 | * | 12/1992 | Muzslay ................................ 439/372 |
| 5,251,101 | * | 10/1993 | Liu ........................................ 361/717 |
| 5,323,845 | * | 6/1994 | Kin-Shon ............................. 165/80.3 |
| 5,448,449 | * | 9/1995 | Bright et al. ........................... 361/704 |
| 5,593,313 | * | 1/1997 | Shibuya et al. ....................... 439/373 |
| 5,734,556 | * | 3/1998 | Saneinejad et al. .................. 361/719 |
| 5,761,036 | * | 6/1998 | Hopfer et al. ......................... 361/704 |
| 6,101,091 | * | 8/2000 | Baik ...................................... 361/704 |

OTHER PUBLICATIONS

A photocopy of a top and bottom view of a "Retention Harness Clip" (Author unknown, undated, 1 pg.).

* cited by examiner

Primary Examiner—Jayprakash N. Gandhi
Assistant Examiner—Thanh Y. Tran
(74) Attorney, Agent, or Firm—Baniak Pine & Gannon

(57) ABSTRACT

A retention clip for retaining a compact flash drive on a PC board includes a flash drive contact portion. The flash drive contact portion includes first and second leg portions extending in an outward direction from the flash drive contact portion. The first leg portion includes a first foot portion extending at an angle from the first leg portion to allow the first foot portion to be inserted into a first opening formed in the PC board. The second leg portion includes a second foot portion extending outward from and parallel to the second leg portion to allow the second foot portion to be inserted in a second opening formed in the PC board. The flash drive contact portion secures the compact flash drive in a fixed position.

23 Claims, 2 Drawing Sheets

RETENTION CLIP FOR RETAINING A COMPACT FLASH DRIVE ON A PC BOARD

FIELD OF THE INVENTION

The present invention relates to retention clips, and, in particular, retention clips for retaining compact flash drives on a PC board, and allowing for relatively simple operation, including easy assembly and disassembly.

BACKGROUND OF THE INVENTION

Retention clips are used to secure electronic devices to a PC board, in an effort to insure proper connection of the electronic devices in cases in which the devices sustain a decent amount of vibration. Additionally, such retention clips are used to provide protection during packaging drop tests and transportation of products. Such retention clips have been used in a number of situations, and are typically installed on the sockets used to couple the electronic devices to its proper connection within a PC board. Such items are commonplace in today's electronic society. However, most retention clips are not installed on the PC board itself, often referred to as "PCB harnessed". Additionally, most retention clips do not provide for an easy method of assembly and disassembly. Accordingly, it would be desirable to provide a retention clip with the above properties that would resolve the above problems and still be simple and efficient to assemble and disassemble.

SUMMARY OF THE INVENTION

One aspect of the invention provides a retention clip for retaining a compact flash drive on a PC board includes a flash drive contact portion. The compact flash drive is preferably inserted into a socket operably attached to the PC board. The flash drive contact portion includes first and second leg portions extending in an outward direction from the flash drive contact portion. The flash drive contact portion may include first and second arm portions. Preferably, the flash drive contact portion is U-shaped. The first leg portion includes a first foot portion extending at an angle from the first leg portion to allow the first foot portion to be inserted into a first, preferably circular, opening formed in the PC board. The first foot portion may extend rearward for 0.150 inches. Preferably, the first leg portion includes a first upper leg portion and a first lower leg portion. The depth of the first leg portion may be 0.250 inches. The second leg portion includes a second foot portion extending outward from and parallel to the second leg portion to allow the second foot portion to be inserted in a second, preferably ovular, opening formed in the PC board. The depth of the second foot portion may be 0.072 inches, and it may extend in an outward direction for 0.125 inches. Preferably, the second leg portion includes a second upper leg portion and a second lower leg portion. Preferably, both the first and second foot portions are L-shaped, as may be the first and second upper and lower leg portions. Preferably, both the first and second lower leg portions extend downward for 0.150 inches. The flash drive contact portion secures the compact flash drive in a fixed position. The total length of the flash drive contact portion and the first and second leg portions may be 1.500 inches.

A further aspect of the invention provides a method of operation of a retention clip for retaining a compact flash drive on a PC board. A flash drive contact portion is provided. The flash drive contact portion includes first and second leg portions. The first leg portion includes a first foot portion. The second leg portion includes a second foot portion. The compact flash drive is inserted into a socket operably attached to the PC board. The first foot portion is inserted into a first opening formed in the PC board. Pressure is applied to first and second arm portions of the flash drive contact portion such that the second foot may be inserted into the second opening. The second foot portion is inserted into the second opening. The pressure applied to the first and second arm portions is released. Pressure may be applied to the first and second arm portions of the flash drive contact portion such that the second foot portion may be removed from the second opening. The second foot portion may be removed from the second opening. The pressure applied to the upper regions of the flash drive portion may be released. The first foot portion may be removed from the first opening.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and the equivalents thereof.

DETAILED DESCRIPTION OF THE PRESENTLY PREFERRED EMBODIMENTS

Figure 1:
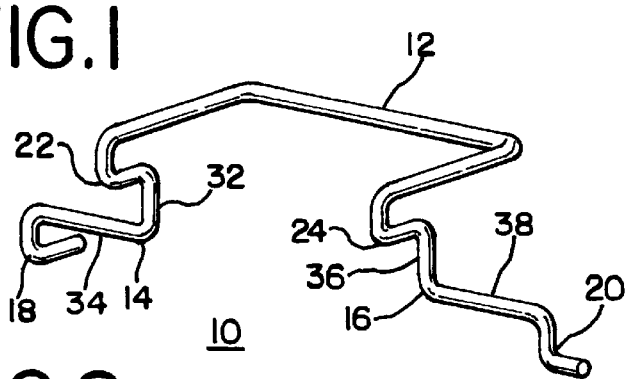
FIG. 1 is a perspective view of a preferred embodiment of a retention clip for retaining a compact flash drive on a PC board, made in accordance with the invention.

Referring to FIG. 1, reference numeral 10 represents a preferred embodiment of a retention clip for retaining a compact flash drive on a PC board, which comprises a flash drive contact portion 12. A first leg portion 14 extends outward from the flash drive contact portion 12. A second leg portion 16 also extends outward from the flash drive contact portion 12. A first foot portion 18 extends outward at an angle from the first leg portion 14. The first foot portion 18 is inserted into a first opening 26 formed within the PC board 28. A second foot portion 20 extends outward from and parallel to the second leg portion 16. The second foot portion 20 is inserted into a second opening 30 formed within the PC board 28.

Also shown in FIG. 1, the first leg portion 14 includes a first upper leg portion 32 and a first lower leg portion 34. The second leg portion 16 further includes a second upper leg portion 36 and a second lower leg portion 38.

Figure 3:
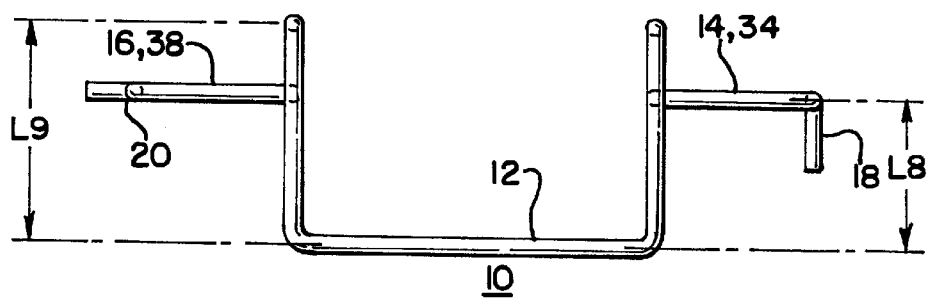
FIG. 3 is a top view of the embodiment of FIG. 1.

Preferably, the material from which the retention clip 10 is constructed is spring temper stainless steel, having a diameter of 0.035 inches. However, the retention clip 10 can be made from any similar material, provided the material has spring temper ability, i.e., it maintains a "memory" and will not be easily bent out of shape. Furthermore, as shown in FIG. 3, the flash drive contact portion 12 of the retention clip 10 is preferably U-shaped. Finally, in order to be inserted in the PC board 28, and not being inadvertently removed therefrom, the foot portions 18, 20 are preferably L-shaped.

Figure 5:
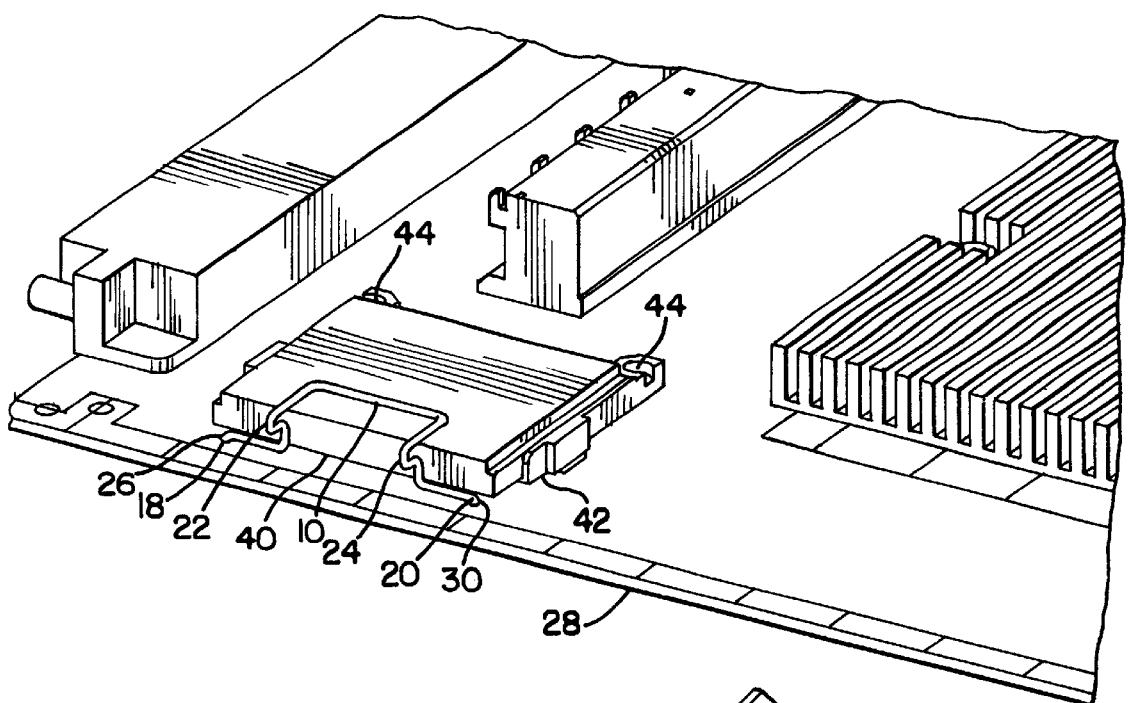
FIG. 5 is a front perspective view of the embodiment of FIG. 1, shown in use on a PC board and retaining a compact flash drive.

As shown in FIG. 5, when properly used, the retention clip 10 will secure the top end of a compact flash drive 40 to the PC board 28. The bottom end of the compact flash drive 40 is inserted into a socket 42, which also provides a means for an electronic coupling. The socket 42 is further operatively attached to the PC board 28, preferably by means of screws 44 or other similar means. Thus, when the retention clip 10 is secured to the PC board 28 by placement of the first foot portion 18 within the first opening 26 and the second foot portion 20 within the second opening 30, the compact flash drive 40 is secured to the PC board 28.

Figure 6:
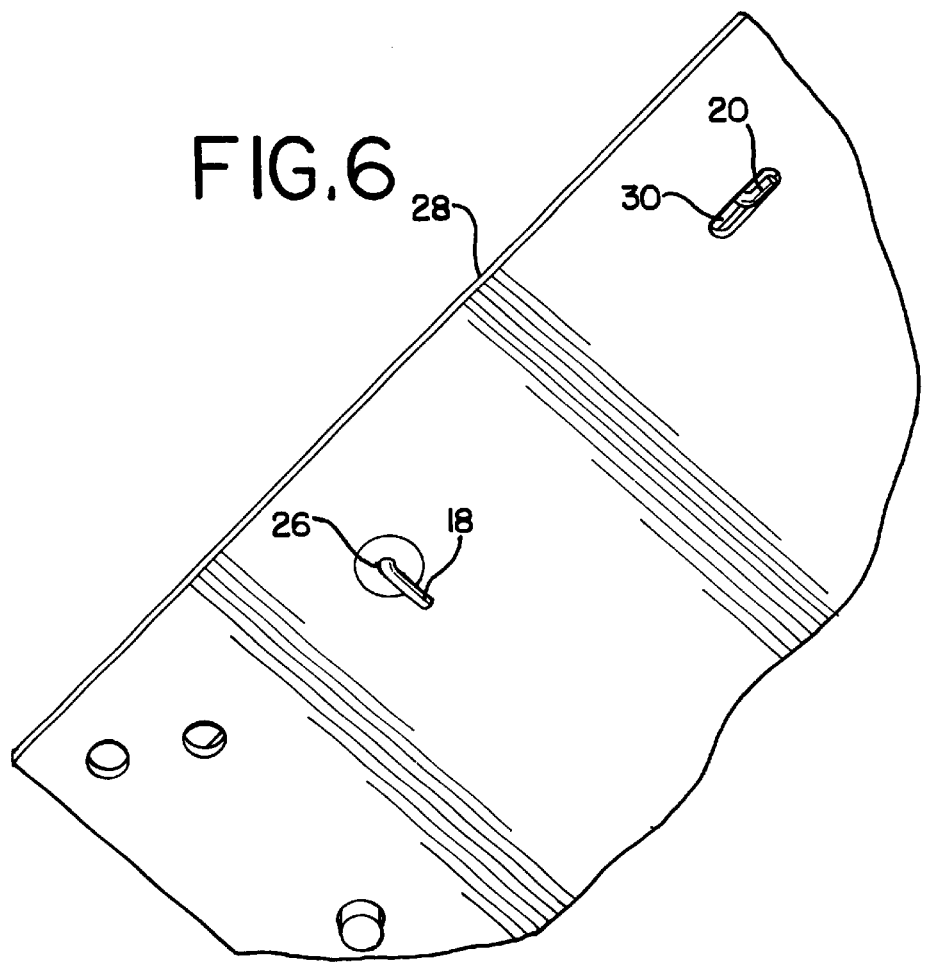
FIG. 6 is a rear perspective view of the embodiment of FIG. 5.

FIG. 6 shows the interaction between the first foot portion 18 within the first opening 26 of the PC board 28 and the second foot portion 20 within the second opening 30 of the PC board 28. FIG. 6 shows the shape of the first opening 26 as being circular. However, the shape of the first opening 26 may also be of any other similar shape that allows the first foot portion 18 to be inserted within the first opening 26, while not allowing the first foot portion 18 to inadvertently dislodge. FIG. 6 also shows the shape of the second opening 30 as being ovular. As is the case with the first opening 30, the shape of the second opening 30 may also be of another shape that allows the second foot portion 20 to be inserted within the second opening 30, while not allowing the second foot portion 20 to inadvertently dislodge.

Additionally, the flash drive contact portion 12 includes a first arm portion 22 and a second arm portion 24. Both arm portions 22, 24 preferably assist in allowing the flash drive contact portion 12 to be inserted into and removed from the PC board 28. After inserting the compact flash drive 40 into the socket 42, insertion of the retention clip 10 may be achieved by first inserting the first foot portion 18 into the first opening 26 on the PC board 28. Pressure is then applied against the arm portions 22, 24, slightly squeezing them together, until the second foot portion 20 can be inserted into the second opening 30 of the PC board. Insertion assembly is then complete and the compact flash drive 40 is now secured within the socket 42 by the retention clip 10.

Removal of the retention clip 10 is just as simple. First, pressure is applied against the arm portions 22, 24, slightly squeezing the arm portions 22, 24 towards each other. At this point, the second foot portion 20 may be removed from the second opening 30. The pressure can then be released from the arm portions 22, 24, and the first foot portion 18 of the retention clip 10 can be removed from the first opening 26.

Figure 2:
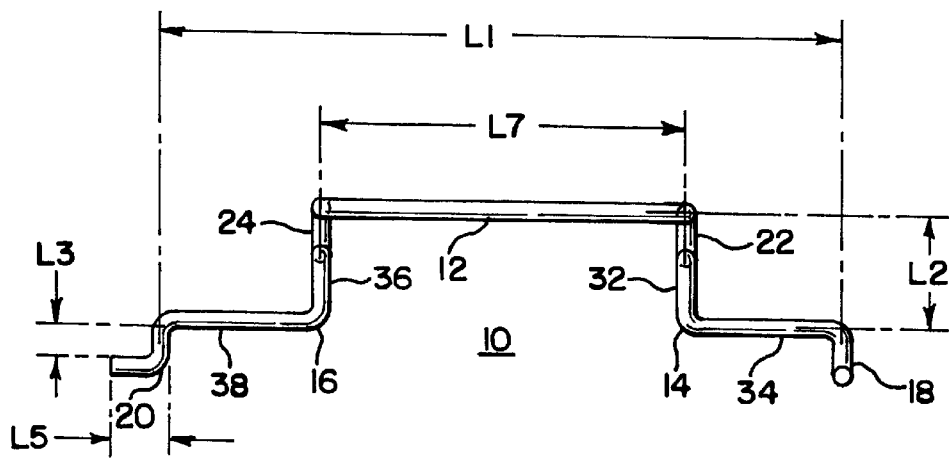
FIG. 2 is a front view of the embodiment of FIG. 1.
Figure 4:
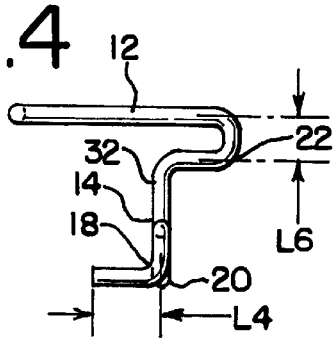
FIG. 4 is a side view of the embodiment of FIG. 1.

Because of space restrictions regarding the PC board 28, the retention clip 10 is restricted with regards to size and length. These restrictions are further highlighted with reference to FIGS. 2–4. For example, the total length of the combined structure of the flash drive contact portion 12 and the leg portions 14, 16 is limited to the distance L1 between the openings 26, 30 disposed on the PC board 28, which may be preferably 1.500 inches. Other length limitations may include the following: The depth of the first leg portion 14, which allows the retention clip 10 to fit over the compact flash drive 40, is represented as L2, and may be preferably 0.250 inches. The depth of the second foot portion 20, allowing the second foot portion 20 to be fitted and maintained within the second opening 30, is represented as L3, and may be preferably 0.072 inches. Additionally, the first foot portion 18 preferably extends in a rearward direction for a distance of L4, which may be preferably 0.150 inches, and the second foot portion 20 extends in an outward direction for a distance of L5, which may be preferably 0.125 inches. The depth of each of the arm portions 22 from the flash drive contact portion 12 is represented as L6, and corresponds preferably to 0.100 inches. The width of the flash drive contact portion 12 is represented as L7, and may be preferably 0.800 inches. The height from the bottom of the flash drive contact portion 12 to each of the leg portions 14, 16 is referenced as L8, and may be preferably 0.325 inches. Finally, the total height of the flash drive contact portion 12 is represented as L9, and may be preferably 0.475 inches. The above-stated preferred measurements all contain a tolerance of ±0.010 inches.

While the embodiments of the present invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A retention clip adapted to be mounted directed to a PC board for retaining a compact flash drive on the PC board, comprising:

a flash drive contact portion, first and second leg portions extending outward from the flash drive contact portion, a first foot portion extending at an angle from the first leg portion to allow the first foot portion to be inserted through a first opening formed in the PC board and to allow the first foot portion to contact a back side of the PC board, and a second foot portion extending outward from and parallel to the second leg portion to allow the second foot portion to be inserted through a second opening formed in the PC board and to allow the second leg portion to contact the back side of PC board;

wherein the flash drive contact portion secures the compact flash drive in a fixed position.

2. The retention clip of claim 1, further comprising a socket operatively attached to the PC board wherein the compact flash drive is inserted into the socket.

3. The retention clip of claim 2, wherein the flash drive contact portion includes first and second arm portions to allow the flash drive contact portion to be inserted into and removed from the first and second openings.

4. The retention clip of claim 3, wherein the first opening formed in the PC board has a circular shape.

5. The retention clip of claim 4, wherein the second opening formed in the PC board has an oval shape.

6. The retention clip of claim 5, wherein the flash drive contact portion is U-shaped.

7. The retention clip of claim 6, wherein the first leg portion includes a first upper leg portion and a first lower leg portion.

8. The retention clip of claim 7, wherein the second leg portion includes a second upper leg portion and a second lower leg portion.

9. The retention clip of claim 8, wherein the first and second foot portions are L-shaped.

10. The retention clip of claim 9, wherein the total length of the flash drive contact portion and the first and second leg portions is 1.500 inches.

11. The retention clip of claim 10, wherein the depth of the first leg portion is 0.250 inches.

12. The retention clip of claim 11, wherein the depth of the second foot portion is 0.072 inches.

13. The retention clip of claim 12, wherein the first lower leg portion extends downward from the first upper leg portion for 0.150 inches.

14. The retention clip of claim 13, wherein the second lower leg portion extends downward from the second upper leg portion for 0.150 inches.

15. The retention clip of claim 14, wherein the first foot portion extends in a rearward direction for 0.150 inches, and the second foot portion extends in an outward direction for 0.125 inches.

16. A method of operation of a retention clip adapted to be mounted directly to a PC board for retaining a compact flash drive on the PC board, providing a flash drive contact portion, and first and second leg portions extending outward from the flash drive contact portion, a first foot portion extending at an angle from the first leg portion, and a second foot portion extending outward from and parallel to the second leg portion;

inserting the compact flash drive into a socket operatively attached to the PC board;

inserting the first foot portion through a first opening formed in the PC board;

applying pressure to first and second arm portions of the flash drive contact portion such that the second foot portion may be inserted through the second opening;

inserting the second foot portion through the second opening;

releasing the pressure applied to the first and second arm portions;

contacting the first foot portion against a back side of the PC board; and contacting the second foot portion against the back side of the PC board thereby mounting the retention clip directly to the PC board.

17. The method of claim 16, further providing the step of applying pressure to the first and second arm portions of the flash drive contact portion such that the second foot portion may be removed from the second opening.

18. The method of claim 17, further providing the step of removing the second foot portion from the second opening.

19. The method of claim 18, further providing the step of releasing the pressure applied to the first and second arm portions of the flash drive contact portion.

20. The method of claim 19, further providing the step of removing the first foot portion from the first opening.

21. An apparatus comprising:

a PC board having first and second openings and a top side and a back side, an electronic device mounted on the PC board, a retention clip mounted directed to the PC board and retaining the electronic device, the retention clip including an electronic device contact portion, first and second leg portions extending outward from the electronic device contact portion, a first foot portion extending at an angle from the first leg portion to allow the first foot portion to be inserted through the first opening formed in the PC board and to allow the first foot portion to contact the back side of the PC board, and a second foot portion extending outward from and parallel to the second leg portion to allow the second foot portion to be inserted through the second opening formed in the PC board and to allow the second leg portion to contact the back side of PC board, wherein the electronic device contact portion secures the electronic device in a fixed position.

22. The apparatus of claim 21 wherein the electronic device is a compact flash drive.

23. The apparatus of claim 21 further comprising a socket operatively attached to the PC board, wherein the electronic device is inserted into the socket.

* * * * *